(12) United States Patent
Scanlan et al.

(10) Patent No.: US 10,050,004 B2
(45) Date of Patent: Aug. 14, 2018

(54) FULLY MOLDED PERIPHERAL PACKAGE ON PACKAGE DEVICE

(71) Applicant: DECA Technologies Inc., Tempe, AZ (US)

(72) Inventors: Christopher M. Scanlan, Chandler, AZ (US); William Boyd Rogers, Raleigh, NC (US); Craig Bishop, Tempe, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 15/356,208

(22) Filed: Nov. 18, 2016

(65) Prior Publication Data

US 2017/0148755 A1    May 25, 2017

Related U.S. Application Data

(60) Provisional application No. 62/258,308, filed on Nov. 20, 2015.

(51) Int. Cl.
*H01L 23/00*     (2006.01)
*H01L 21/48*     (2006.01)
(Continued)

(52) U.S. Cl.
CPC ............ *H01L 24/19* (2013.01); *H01L 21/486* (2013.01); *H01L 21/561* (2013.01);
(Continued)

(58) Field of Classification Search
None
See application file for complete search history.

(56) References Cited

U.S. PATENT DOCUMENTS

| 4,740,414 A | 4/1988 | Shasheen |
| 5,548,091 A | 8/1996 | Distefano et al. |

(Continued)

FOREIGN PATENT DOCUMENTS

| JP | 3255970 A | 11/1991 |
| WO | WO2009006284 | 1/2009 |

(Continued)

OTHER PUBLICATIONS

Kwak, Hocheol and Hubing. TODD, An Overview of Advanced Electronic Packaging Technology, May 1, 2007.
(Continued)

*Primary Examiner* — Khaja Ahmad
(74) *Attorney, Agent, or Firm* — Booth Udall Fuller PLC

(57) ABSTRACT

A method of making a semiconductor device can comprise providing a temporary carrier comprising a semiconductor die mounting site, and forming an insulating layer over the temporary carrier. Conductive pads can be formed within openings in the insulating layer and be positioned both within and without the die mounting area. A backside redistribution layer (RDL) can be formed over the temporary carrier before mounting a semiconductor die at the die mounting site. Conductive interconnects can be formed over the temporary carrier in a periphery of the semiconductor die mounting site. A semiconductor die can be mounted face up to the insulating layer. The conductive interconnects, backside RDL, and semiconductor die can be encapsulated with a mold compound. A build-up interconnect structure can be formed and connected to the semiconductor die and the conductive interconnects. The temporary carrier can be removed and the conductive pads exposed in a grinding process.

20 Claims, 9 Drawing Sheets

(51) Int. Cl.
*H01L 21/56* (2006.01)
*H01L 23/373* (2006.01)
*H01L 23/538* (2006.01)
*H01L 21/683* (2006.01)
*H01L 23/31* (2006.01)
*H01L 25/10* (2006.01)

(52) U.S. Cl.
CPC ...... *H01L 21/6835* (2013.01); *H01L 23/3731* (2013.01); *H01L 23/5384* (2013.01); *H01L 23/5389* (2013.01); *H01L 24/97* (2013.01); *H01L 21/568* (2013.01); *H01L 23/3128* (2013.01); *H01L 25/105* (2013.01); *H01L 2221/6835* (2013.01); *H01L 2221/68331* (2013.01); *H01L 2221/68345* (2013.01); *H01L 2221/68359* (2013.01); *H01L 2221/68372* (2013.01); *H01L 2221/68381* (2013.01); *H01L 2224/04105* (2013.01); *H01L 2224/12105* (2013.01); *H01L 2224/19* (2013.01); *H01L 2224/32225* (2013.01); *H01L 2224/73267* (2013.01); *H01L 2224/92244* (2013.01); *H01L 2224/97* (2013.01); *H01L 2225/1035* (2013.01); *H01L 2225/1041* (2013.01); *H01L 2225/1058* (2013.01); *H01L 2924/3511* (2013.01)

(56) References Cited

U.S. PATENT DOCUMENTS

| | | |
|---|---|---|
| 7,456,496 B2 | 11/2008 | Hwee et al. |
| 7,476,980 B2 | 1/2009 | Rebibis et al. |
| 7,482,203 B2 | 1/2009 | Song et al. |
| 7,550,857 B1 | 6/2009 | Longo et al. |
| 7,777,351 B1 | 8/2010 | Berry et al. |
| 7,829,380 B2 | 11/2010 | Irsigler et al. |
| 7,843,052 B1 | 11/2010 | Yoo et al. |
| 7,888,184 B2 | 2/2011 | Shim et al. |
| 8,030,770 B1 | 10/2011 | Juskey et al. |
| 8,237,259 B2 | 8/2012 | Pressel et al. |
| 8,288,209 B1 | 10/2012 | Chi et al. |
| 8,354,304 B2 | 1/2013 | Chow et al. |
| 8,436,255 B2 | 5/2013 | Goh |
| 8,487,435 B2 | 7/2013 | Juskey et al. |
| 8,653,674 B1 | 2/2014 | Darveaux et al. |
| 8,669,655 B2 | 3/2014 | Geitner et al. |
| 2002/0092676 A1* | 7/2002 | Jimarez ............... H01L 21/4857 174/262 |
| 2003/0027373 A1 | 2/2003 | Distefano et al. |
| 2003/0092217 A1 | 5/2003 | Coyle |
| 2003/0164554 A1 | 9/2003 | Fee et al. |
| 2005/0208700 A1 | 9/2005 | Kwon et al. |
| 2006/0275949 A1 | 12/2006 | Farnworth et al. |
| 2006/0291029 A1 | 12/2006 | Lin et al. |
| 2008/0237828 A1 | 10/2008 | Yang |
| 2009/0302484 A1 | 12/2009 | Lee et al. |
| 2010/0052135 A1 | 3/2010 | Shim et al. |
| 2010/0167471 A1 | 7/2010 | Jin et al. |
| 2010/0195299 A1 | 8/2010 | Souriau et al. |
| 2010/0308474 A1 | 12/2010 | Shibuya et al. |
| 2011/0001215 A1 | 1/2011 | Lam |
| 2011/0042796 A1 | 2/2011 | Chang et al. |
| 2011/0095413 A1 | 4/2011 | Barth et al. |
| 2011/0156250 A1 | 6/2011 | Goh et al. |
| 2011/0186977 A1 | 8/2011 | Chi et al. |
| 2011/0193205 A1 | 8/2011 | Hsieh |
| 2011/0202896 A1 | 8/2011 | Scanlan et al. |
| 2011/0250396 A1 | 10/2011 | Matsutani et al. |
| 2011/0254156 A1* | 10/2011 | Lin ............... H01L 21/566 257/737 |
| 2012/0032314 A1 | 2/2012 | Chen et al. |
| 2012/0119373 A1 | 5/2012 | Hunt |
| 2012/0133001 A1 | 5/2012 | Tkaczyk et al. |
| 2013/0026658 A1 | 1/2013 | Chen |
| 2013/0062760 A1 | 3/2013 | Hung et al. |
| 2013/0168848 A1 | 7/2013 | Lin et al. |
| 2013/0168849 A1 | 7/2013 | Scanlan |
| 2013/0270682 A1 | 10/2013 | Hu et al. |
| 2013/0307140 A1 | 11/2013 | Huang et al. |
| 2013/0334698 A1 | 12/2013 | Mohammed et al. |
| 2014/0042600 A1 | 2/2014 | Kim et al. |
| 2014/0054802 A1 | 2/2014 | Shim |
| 2014/0057394 A1 | 2/2014 | Ramasamy et al. |
| 2014/0070403 A1* | 3/2014 | Pan ............... H01L 21/56 257/737 |
| 2014/0077361 A1* | 3/2014 | Lin ............... H01L 22/14 257/737 |
| 2014/0252646 A1* | 9/2014 | Hung ............... H01L 23/481 257/774 |
| 2014/0264930 A1* | 9/2014 | Yu ............... H01L 24/19 257/774 |
| 2016/0071820 A1* | 3/2016 | Yu ............... H01L 21/6835 257/737 |

FOREIGN PATENT DOCUMENTS

| | | |
|---|---|---|
| WO | WO2009009436 | 1/2009 |
| WO | WO2010/080068 A1 | 7/2010 |

OTHER PUBLICATIONS

Kripesh, Vaidyanathan et al., Design and Development of a Multi-Die Embedded Micro Wafer Level Package, Institute of Microelectronics, Singapore, 2008.
Micronews, Fan-in WLCSP matures, what's next?, 3 D Packaging Magazine, Issue 14, Feb. 2008, pp. 2-5.
TH, E.K. et al, Encapsulation Challenges for Wafer Level Packaging, Electronics Packaging Technology Conference, 2009.
R Anderson, et al., Advances in WLCSP Technologies for Growing Market Needs, SMTA's 6th AMual International Wafer Level Packaging Conference, Oct. 27-30, 2009, Santa Clara, CA.
Kanth et al., Design and Development of True-CSP, United Test & Assembly Center Ltd (UTAC).
Hunt, John, Value Engineered Wafer Level Packages for Mobile Devices, Jul. 9, 2013.
Fan et al., Design and optimization of thermo-mechanical reliability in wafer level packaging, Jul. 4, 2009.
Motohashi et al., System in Wafer-Level Package Technology with RDL-first Process, Kanagawa, Japan.
Nishio, 3D package technologies review with gap analysis for mobile application requirements, STATS ChipPAC, Japan, Apr. 22, 2014.
Krohnert et al., System-in-package (SiP) on wafer level, enabled by fan-out WLP (eWLB), Portugal.
Flack et al., Lithography Technique to Reduce the Alignment Errors from Die Placement in Fan-out Wafer Level Packaging Applications, San Jose, CA.
Exposed, Merriam-Webster, merriam-webster.com/dictionary/exposed.
Thick Copper(Cu) RDL, Chipbond website.
Yannou, An overview of recent panel-scale packaging developments throughout the industry, MiNaPAD conference, Grenoble, Apr. 24, 2012.
WLCSP (FiWLP Technology), Wafer level chip scale package.

* cited by examiner

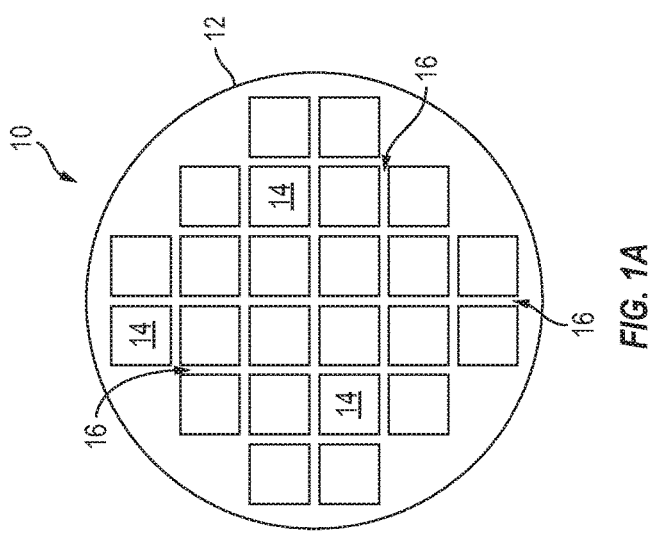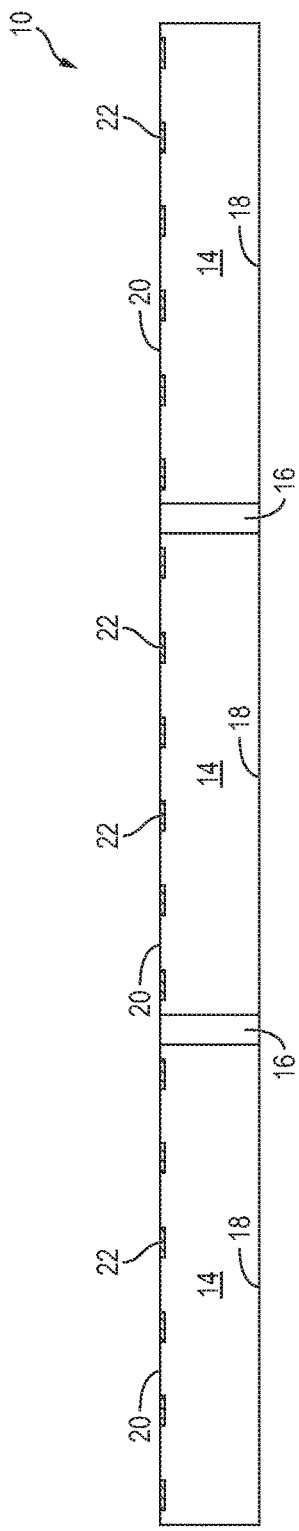

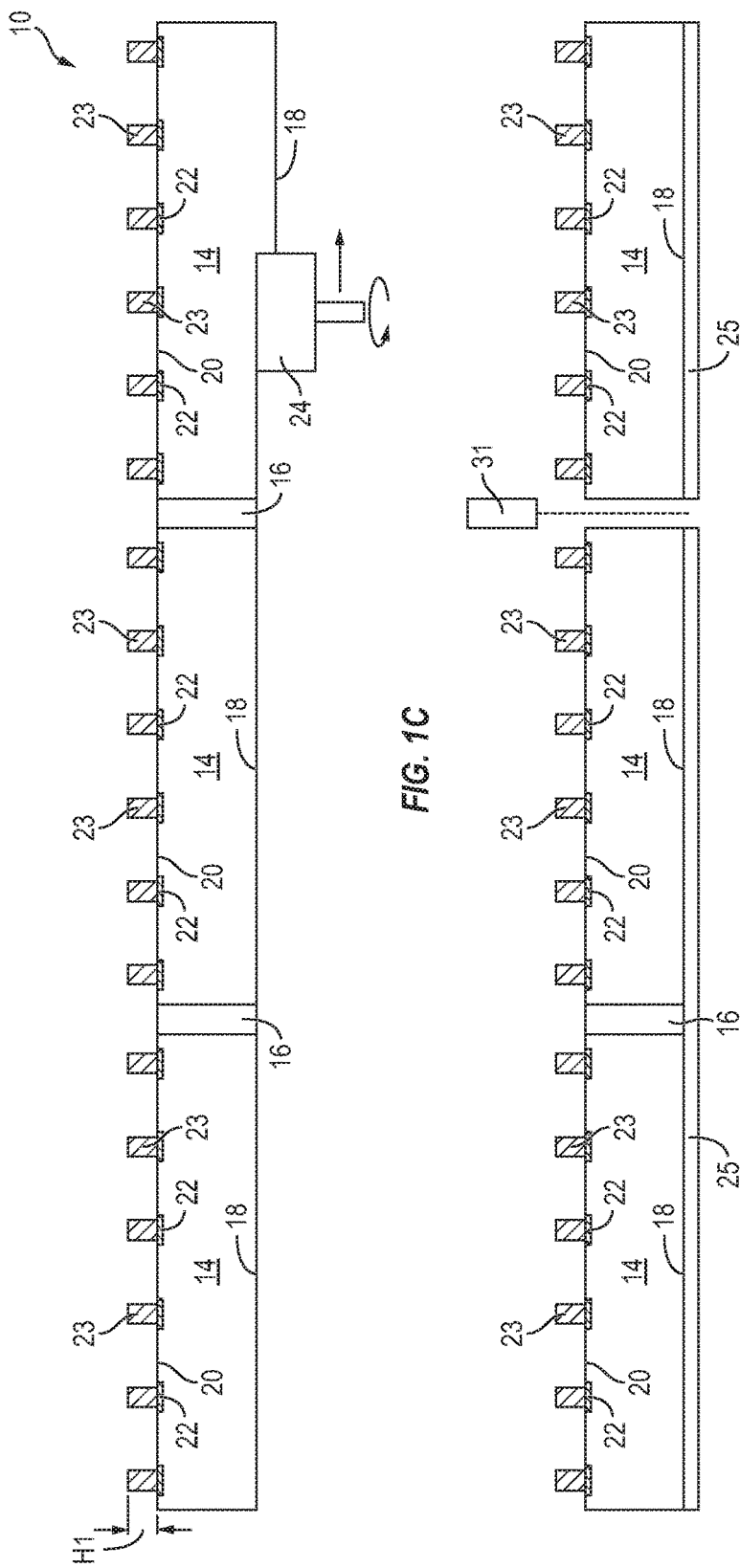

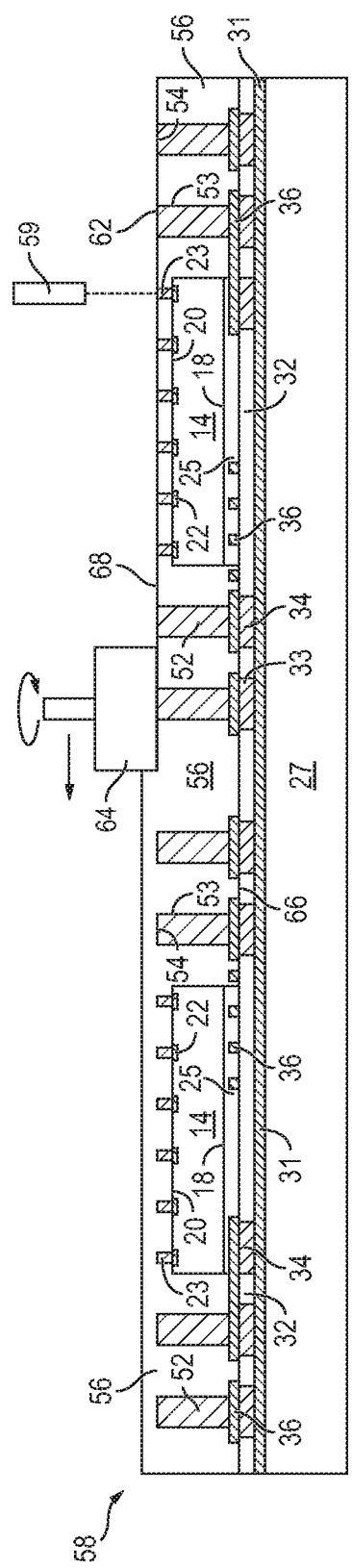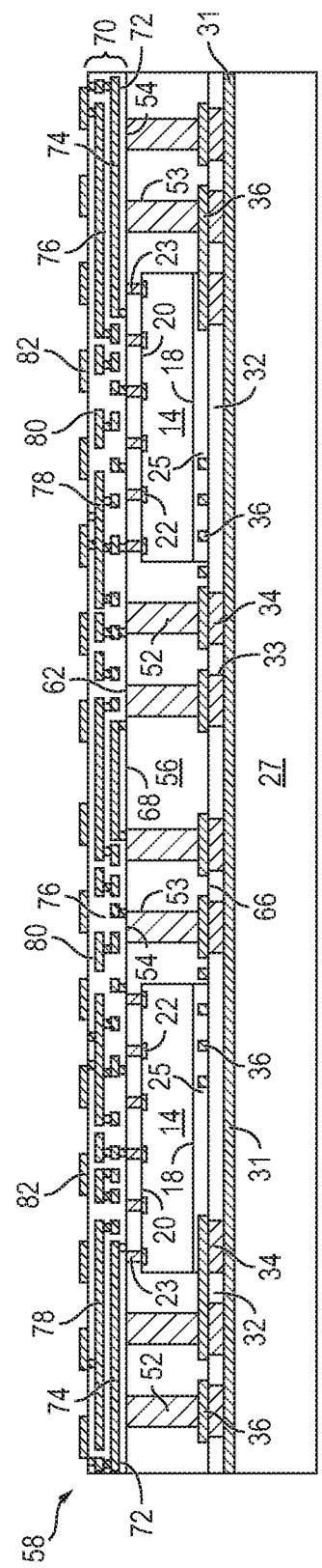

FULLY MOLDED PERIPHERAL PACKAGE ON PACKAGE DEVICE

CROSS-REFERENCE TO RELATED APPLICATIONS

This application claims the benefit, including the filing date, of U.S. Provisional Patent No. 62/258,308, entitled "Three-Dimensional Fully Molded Semiconductor Package," which was filed on Nov. 20, 2015, the disclosure of which is hereby incorporated herein by this reference.

TECHNICAL FIELD

The disclosure relates to a fully molded semiconductor package, and method of making the same, that includes a peripheral area around a semiconductor die comprising vertically oriented electrical interconnects that facilitate of package on package (PoP) stacking of multiple semiconductor packages.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

On opportunity exists for improved semiconductor manufacturing. Accordingly, in one aspect, a method of making a semiconductor device, comprises providing a temporary carrier comprising a semiconductor die mounting site, forming an insulating layer over the temporary carrier, and forming conductive pads within openings in the insulating layer that are positioned both within and without the die mounting area. A backside redistribution layer (RDL) can be formed over the temporary carrier, the insulating layer, and the conductive pads before mounting a semiconductor die at the die mounting site. Conductive interconnects can be formed over the temporary carrier in a periphery of the semiconductor die mounting site. A semiconductor die can be mounted face up to the insulating layer at the semiconductor die mounting site. The conductive interconnects, backside RDL, and semiconductor die can be encapsulated with a mold compound. A build-up interconnect structure can be formed and connected to the semiconductor die and the conductive interconnects. The temporary carrier can be removed and expose the conductive pads in a second grinding process.

The method of making a semiconductor device can further comprise the insulating layer comprising an epoxy resist laminate with a height or thickness H2 greater than 25 micrometers (μm), and the insulating layer, pads, and conductive layer forming a backside build-up interconnect structure. The conductive pads can comprise a height or thickness H2 greater than 25 μm, and a width W1 greater than 60 μm. The conductive interconnects can comprise copper posts comprising a height H3 greater than 100 μm. A height or overall body thickness of the semiconductor device can be less than or equal to 300 μm. The temporary carrier can be formed of a same material as the mold compound, the insulating layer, or both, to reduce a CTE mismatch and warpage during processing of the semiconductor device. The backside RDL can comprise a fine pitch in a range of 10-30 μm.

In another aspect, a method of making a semiconductor device can comprise providing a temporary carrier comprising a semiconductor die mounting site, and forming a backside RDL over the temporary carrier before mounting a semiconductor die at the die mounting site. Conductive interconnects can be formed over the temporary carrier in a periphery of the semiconductor die mounting site. A semiconductor die can be mounted face up to the insulating layer at the semiconductor die mounting site. The conductive interconnects, backside RDL, and semiconductor die can be encapsulate with a mold compound. A build-up interconnect structure can be formed connected to the semiconductor die and the conductive interconnects, and the temporary carrier can be removed.

The method of making a semiconductor device can further comprise forming an insulating layer over a temporary carrier, and forming conductive pads within openings in the insulating layer before mounting the semiconductor die over the carrier, wherein the conductive pads are electrically connected to the backside RDL. The conductive pads can be positioned both within and without the die mounting area to be disposed both within and without a footprint of the semiconductor die. The insulating layer can comprise an epoxy resist laminate with a height or thickness $H2$ greater than 25 µm, and the insulating layer, pads, and conductive layer can form a backside build-up interconnect structure. The temporary carrier can be formed of a same material as the mold compound to reduce a CTE mismatch and warpage during processing of the semiconductor device, and the temporary carrier can be removed in a grinding process. A height or overall body thickness of the semiconductor device can be less than or equal to 300 µm. The conductive interconnects can comprise copper posts comprising a height $H3$ greater than 100 µm.

In another aspect, a method of making a semiconductor device can comprise providing a temporary carrier, forming an insulating layer over temporary carrier, forming conductive pads within openings in the insulating layer, and forming conductive interconnects over the temporary carrier. A semiconductor die can be mounted over the temporary carrier amidst the conductive interconnects. The conductive interconnects and semiconductor die can be encapsulated with a mold compound. A build-up interconnect structure can be formed over the semiconductor die and the conductive interconnects. The temporary carrier can be removed to expose the conductive pads.

The method of making a semiconductor device can further comprise forming a backside RDL over the temporary carrier before mounting the semiconductor die over the carrier. The temporary carrier can be formed of a same material as the mold compound to reduce a CTE mismatch and warpage during processing of the semiconductor device. The temporary carrier can be removed in a grinding process to expose the conductive pads. The insulating layer and conductive pads can form a backside build-up interconnect structure over the temporary carrier before mounting the semiconductor die to the build-up interconnect structure and over the temporary carrier. The insulating layer can comprise an epoxy resist laminate with a height or thickness $H2$ greater than 25 µm, and the conductive pads can comprise a height or thickness $H2$ greater than 25 µm, and a width $W1$ greater than 60 µm. The conductive interconnects can comprise copper posts comprising a height $H3$ greater than 100 µm.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 1A-1D illustrate semiconductor die from a native wafer comprising electrical interconnects.

FIGS. 2A-2K illustrate an aspect of forming fully molded peripheral PoP devices.

DETAILED DESCRIPTION

Figure 2A:
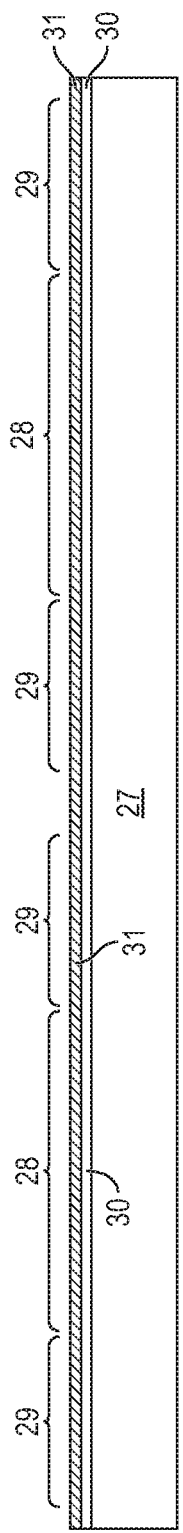

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIG. 1A shows a plan view of a semiconductor wafer or native wafer 10 with a base substrate material 12, such as, without limitation, silicon, germanium, gallium arsenide, indium phosphide, or silicon carbide, for structural support. A plurality of semiconductor die or components 14 can be formed on wafer 10 separated by a non-active, inter-die wafer area or saw street 16 as described above. The saw street 16 can provide cutting areas to singulate the semiconductor wafer 10 into the individual semiconductor die 14.

FIG. 1B shows a cross-sectional profile view of a plurality of semiconductor die 14 from the native wafer 10, shown in FIG. 1A. Each semiconductor die 14 has a backside or back surface 18 and an active surface 20 opposite the backside 18. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 operates as contact pads or bond pads electrically coupled or connected to the circuits on active surface 20. Conductive layer 22 can be formed as contact pads disposed side-by-side a first distance from the edge of semiconductor die 14, as shown in FIGS. 1B-1D. Alternatively, conductive layer 22 can be formed as contact pads that are offset in multiple rows such that a first row of contact pads is disposed a first distance from the edge of the die, and a second row of contact pads alternating with the first row is disposed a second distance from the edge of the die.

An optional insulating or passivation layer can be conformally applied over active surface 20 and over conductive layer 22. The insulating layer can include one or more layers that are applied using PVD, CVD, screen printing, spin coating, spray coating, sintering, thermal oxidation, or other suitable process. The insulating layer can contain, without limitation, one or more layers of silicon dioxide (SiO2), silicon nitride (Si3N4), silicon oxynitride (SiON), tantalum pentoxide (Ta2O5), aluminum oxide (Al2O3), polymer, polyimide, benzocyclobutene (BCB), polybenzoxazoles (PBO), or other material having similar insulating and structural properties. Alternatively, semiconductor die 14 can be packaged without the use of any PBO layers, and the insulating layer can be formed of a different material or omitted entirely. In another embodiment, the insulating layer can includes a passivation layer formed over active surface 20 without being disposed over conductive layer 22. When the insulating layer is present and formed over conductive layer 22, openings are formed completely through the insulating layer to expose at least a portion of conductive layer 22 for subsequent mechanical and electrical interconnection. Alternatively, when the insulating layer is omitted, conductive layer 22 is exposed for subsequent electrical interconnection without the formation of openings.

FIG. 1C shows conductive interconnects or electrical interconnect structures 23 that can be formed as columns, pillars, posts, thick redistribution layers (RDLs), bumps, or studs that are formed of copper or other suitable conductive material, which are disposed over, and coupled or connected to, conductive layer 22. Conductive interconnects 23 can be formed directly on conductive layer 22 using patterning and metal deposition processes such as printing, PVD, CVD, sputtering, electrolytic plating, electroless plating, metal evaporation, metal sputtering, or other suitable metal deposition process. Conductive interconnects 23 can be one or more layers of Al, Cu, Sn, Ni, Au, Ag, palladium (Pd), or other suitable electrically conductive material and can include one or more UBM layers. In some embodiments, conductive interconnects 23 can be formed by depositing a photoresist layer over the semiconductor die 14 and conductive layer 22. A portion of the photoresist layer can be exposed and removed by an etching development process, and the conductive interconnects 23 can be formed as copper pillars in the removed portion of the photoresist and over conductive layer 22 using a selective plating process. The photoresist layer can be removed leaving conductive interconnects 23 that provide for subsequent mechanical and electrical interconnection and a standoff with respect to active surface 20. Conductive interconnects 23 can include a height H1 in a range of 10-100 micrometers (μm) or a height in a range of 20-50 μm, or a height of about 35 μm.

FIG. 1C also shows the semiconductor wafer 10 can undergo an optional grinding operation with a grinder 24 to planarize the surface and reduce a thickness of the semiconductor wafer 10. A chemical etch can also be used to remove and planarize a portion of the semiconductor wafer 10.

FIG. 1D shows attaching a die attach film (DAF) 25 to the semiconductor wafer 10 that can be disposed over, and in direct contact with, the backsides 18 of the semiconductor die 14. The DAF 25 can comprise epoxy, thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, epoxy resin with organic filler, silica filler, or polymer filler, acrylate based adhesive, epoxy-acrylate adhesive, a polyimide (PI) based adhesive, or other adhesive material.

FIG. 1D also shows semiconductor wafer 10 can be singulated through gaps or saw streets 16 using laser grooving, a saw blade or laser cutting tool 26, or both to singulate the semiconductor wafer 10 into individual semiconductor die 14 with conductive bumps 23. In some instances a laser tool 26 can be used to form laser grooves in the saw streets 16, and a wafer saw can then singulate the individual semiconductor die 14 along the laser grooves. The semiconductor die 14 can then be used as part of a subsequently formed semiconductor component package as discussed in greater detail below with respect to FIGS. 2A-3.

FIG. 2A shows providing a temporary carrier, temporary substrate, or molded panel 27, on which subsequent processing of the semiconductor devices, semiconductor component packages, or fully molded peripheral PoP devices or packages 90 can occur, as described in greater detail herein. The temporary carrier 27 can contain base material such as metal, silicon, polymer, polymer composite, ceramic, glass, glass epoxy, stainless steel, or other suitable low-cost, rigid material or bulk semiconductor material for structural support. The temporary carrier can be circular, square, rectangular, or other suitable or desirable shape and can include any desirable size, such as a size equal to, similar to, or slightly larger or smaller than a reconstituted wafer or panel that is subsequently formed on or over the temporary carrier 27. In some instances, a diameter, length, or width of the temporary carrier can be equal to, or about, 200 millimeters (mm), 300 mm, or more.

The molded panel 27 can be used in place of a conventional carrier with temporary tape. Therefore, after processing, the molded panel or temporary carrier 27 can be removed, e.g. by grinding rather than releasing of temporary tape as has been conventionally done. The blank epoxy panel 27 can be made of a same material as the mold compound 56, the epoxy resist laminate 32, or both, to reduce a CTE mismatch and reduce warpage during thermal cycling, as well as to improve processing and the structures formed during processing, such as the fine pitch conductive layer 36.

The temporary carrier 27 can comprise a plurality of semiconductor die mounting sites or die attach areas 28 spaced or disposed across a surface of the temporary carrier 27, according to a design and configuration of the final semiconductor devices 90, to provide a peripheral area or space 29. The peripheral area 29 can partially or completely surround the die attach areas 28 to provide space for subsequent vertical, through package interconnections, and an area for fan-out routing or build-up interconnect structures.

An optional interface layer or double-sided tape 30 can be formed over carrier 27 as a temporary adhesive bonding film or etch-stop layer. The temporary carrier 27 can be subsequently removed by strip etching, chemical etching, mechanical peel-off, CMP, plasma etching, thermal, light releasing process, mechanical grinding, thermal bake, laser scanning, UV light, or wet stripping. While the interface layer 30 is shown in FIG. 2A, for convenience and simplicity, the optional interface layer 30 has been omitted from subsequent FIGS. although a person of ordinary skill will understand that the interface layer 30 can remain and be present in processing shown in the other FIGS. In some instances, the carrier 27 can be formed as a blank epoxy panel that is subsequently removed by grinding.

FIG. 2A also shows forming a seed layer 31 over the temporary carrier 27 and the interface layer 30, when present, so that the seed layer 31 can be in direct contact with the surface of the temporary carrier 27, or in direct contact with the interface layer 30, when present. The seed layer 31 can be one or more layers of Al, Cu, Sn, Ni, Au, Ag, or other suitable electrically conductive material. The formation, placement, or deposition of the seed layer 31 can be with PVD, CVD, electrolytic plating, electroless plating, or other suitable process. In some embodiments, the seed layer 31 can include Ti/Cu, TiW/Cu, or a coupling agent/Cu. The seed layer 31 can be deposited by sputtering, electroless plating, or by depositing laminated foil, such as Cu foil, combined with electroless plating.

Figure 2B:
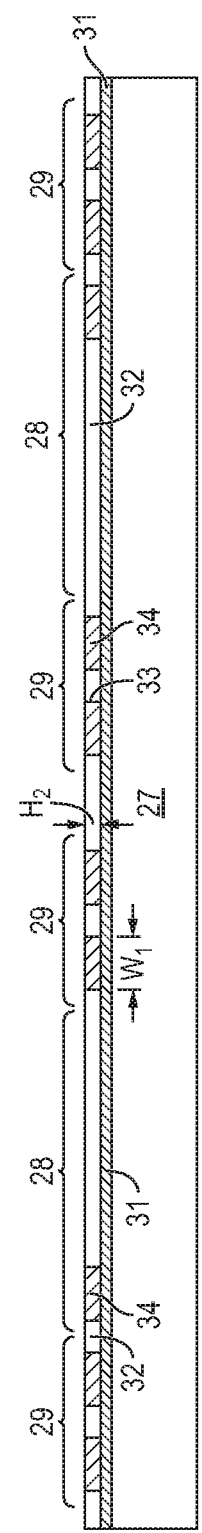

FIG. 2B shows an insulating or passivation layer 32 formed over the seed layer 31 and covering an entirety or substantially an entirety of the seed layer 31 over the carrier 27. The insulating layer 32 can be an epoxy resist laminate, and can also be formed of one or more layers of $SiO_2$, $Si_3N_4$, SiON, $Ta_2O_5$, $Al_2O_3$, or other material having similar insulating and structural properties. The insulating layer 32 can also be formed of a material that is the same or similar to the material used in the temporary carrier 27 or the encapsulant 56. The insulating layer 72 can be formed using PVD, CVD, printing, spin coating, spray coating, sintering, or thermal oxidation. The insulating layer 32 can comprise a height or thickness H2 that is in a range of 20-40 μm, that is greater than 25 μm, or that is about 30 μm. Openings or conductive vias 33 can be formed through the insulating layer 72 over the conductive interconnects 52 and the conductive bumps 23 to connect with the semiconductor die 14. The openings 33 can be formed through and expose and develop process, followed by an after develop inspection (ADI) to ensure the openings were properly formed and expose the seed layer 31. A descum process can also be undertaken to clean the insulting layer 32 and the openings 33. The openings 33 can extend completely through the insulating layer 32, and as such the openings 33 can also comprise the same height H1 as the insulating layer 32. The openings 33 can also comprise a cross-sectional shape (as seen in the a plan view taken perpendicular to the view shown in FIG. 2B, as shown in 2F) that is circular, oval, square, rectangular, or of any other desirable shape. The openings 33 can further comprise a width or diameter W1 in a range of 60-200 μm, 100-160 μm, of about 130 μm, or greater than 60 μm.

FIG. 2B also shows a pad, conductive pad, conductive interconnect, electrical interconnect structure, stud, shortened post, pillar, or column 34 can be formed in the openings 33 in the insulating layer 32. The conductive pads 34 can be formed within openings 33 in the insulating layer 32, the pads 34 being positioned both within and without the die mounting area 28, so as to be both within a footprint of the subsequently mounted semiconductor die 14, and without a footprint of the die mounting area 28 and the footprint of the subsequently mounted semiconductor die 14. The pads 34 can be formed of copper or other suitable conductive material. Pads 34 can be formed using patterning and metal deposition processes such as printing, PVD, CVD, sputtering, electrolytic plating, electroless plating, metal evaporation, metal sputtering, or other suitable metal deposition process. When pads 34 are formed by plating, the seed layer 31 can be used as part of the plating process. Pads 34 can be one or more layers of Al, Cu, Sn, Ni, Au, Ag, Pd, solder, or other suitable electrically conductive material and can include one or more layers. When forming the conductive pads 34 of multiple portions, such as vertically stacked portions of different conductive materials, the plating or formation of the pads 34 can be part of multiple sequential processes. After formation of the pads 34, the insulating layer 32 can remain, rather than being removed, such as by a stripping process, thereby forming a part of the final package 90. As such, portions of the insulating layer 32 can be exposed at, or form part of, outer surfaces of the package 90, such as a topside or backside of the package 90. After formation of the conductive pads 34, the pads, such as a top surface of the pads 34, and the insulating layer 32 can undergo a planarization process in which material can be removed from the surface of the insulating layer 32 and the pads 34 to produce a uniformly flat surface. The uniformly flat surface can advantageously facilitate the subsequent formation or reception of additional layers and structures, as shown in FIG. 2C.

Figure 2C:
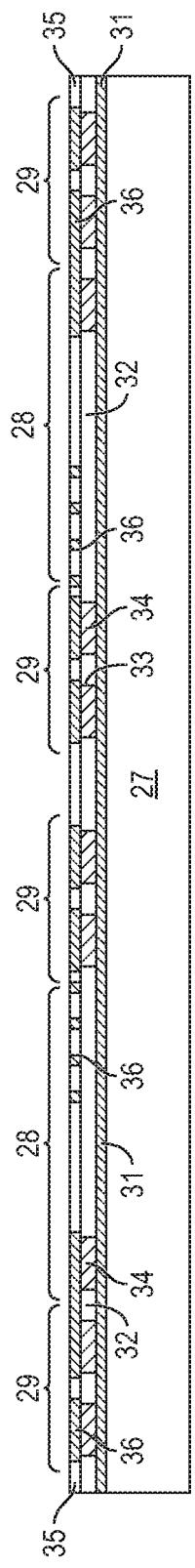

FIG. 2C shows forming or depositing a resist layer, photoresist, resist laminate, or photosensitive layer 35 over the insulating layer 32, the pads 34, and the temporary carrier 27. In some instances, a seed layer (not shown) can be deposited over the insulating layer 32 and the pads 34 before formation or placement of the of the resist layer 35, such as by sputtering, to help facilitate the formation or performance of a subsequently formed conductive layer, such as the conductive layer 36. After formation of the resist layer 35, the resist layer 35 can then be exposed and developed to form openings in the resist layer 48. The openings can be positioned over, or within a footprint of, the peripheral area 29 of the temporary carrier 27 as well as within the semiconductor die mounting sites 28. The openings can extend completely through the resist layer 35, such as from a first surface or bottom surface of the resist layer 35 to second surface or top surface of the resist layer 35 opposite the first surface. An ADI of the developed resist layer 35 can be performed to detect the condition or quality of the openings. After the ADI of resist layer 35, a descum operation can be performed on the developed resist layer 35.

FIG. 2C also shows the formation of the conductive layer or RDL 36 within the openings in the resist layer 35 that can comprise conductive traces and conductive pads formed of copper or other suitable conductive material. Conductive layer 36 can be formed using patterning and metal deposition processes such as printing, PVD, CVD, sputtering, electrolytic plating, electroless plating, metal evaporation, metal sputtering, or other suitable metal deposition process. When conductive layer 36 is formed by plating, the seed layer can be used as part of the plating process. Conductive layer 36 can be one or more layers of Al, Cu, Sn, Ni, Au, Ag, Pd, solder, or other suitable electrically conductive material and can include one or more layers. The conductive layer can comprise fine pitch RDLs and traces with a fine pitch of, or about, 14 µm (and corresponding 7 µm lines and spaces (l/s)) or a pitch in a range of 10-30 µm. The conductive layer can comprise a thickness in a range of 3-8 µm, or about 5 µm. After formation of the conductive layer 36, the resist layer 35 can be removed, such as by a stripping process, leaving conductive layer 36 formed over, and in contact with, the conductive pads 34 for subsequent vertical or three dimensional (3D) electrical interconnection for the semiconductor devices or packages 90. The conductive layer or RDL 36 can be formed as a topside or backside RDL that is formed on or over the temporary carrier 27 before placing or mounting the semiconductor die 28 over or on the temporary carrier 27 at the die mounting site 28.

After the formation of the conductive layer 36, the resist layer 35 can be stripped or removed and the insulating layer or epoxy resist laminate 32, pads 34, and conductive layer 36 can remain to form a backside or topside build-up interconnect structure 38 over the temporary carrier 27. The backside build-up interconnect structure 38 can be formed over the temporary carrier 27 and be in place before the subsequent mounting of the semiconductor die 14 over the temporary carrier 27 and the build-up interconnect structure 38. While the backside build-up interconnect structure 38 has, for convenience, been shown and described with respect to the three layers or features 32, 34, and 36, more layer, or fewer layers, can also be used, according to the configuration and design of the package or semiconductor device 90.

Figure 2D:
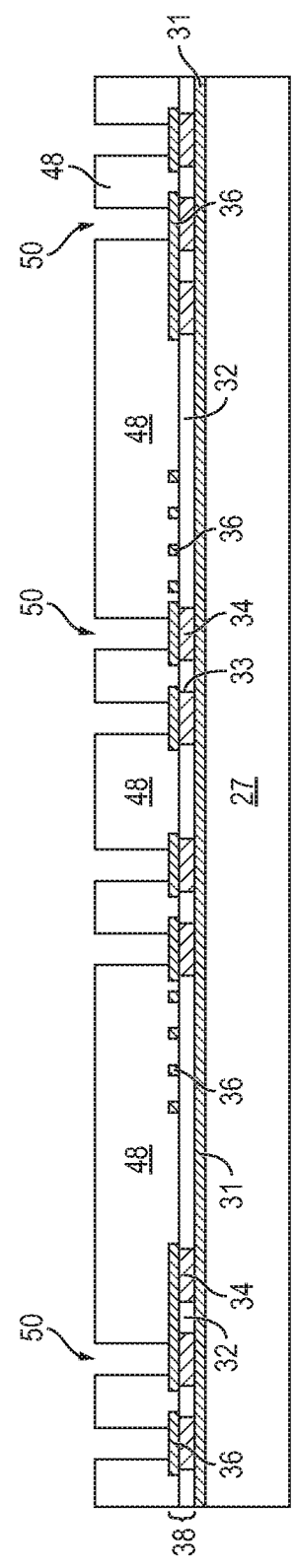

Continuing from FIG. 2C, FIG. 2D shows forming or depositing a resist layer, photoresist, resist laminate, photosensitive layer 48 over the temporary carrier 27, and conformally applied to surfaces (such as top surface, side surface, or both) of both the insulating layer 32 and the conductive layer 36. In some instances, a seed layer (not shown) can be deposited over the insulating layer 32 and the conductive layer 36 before formation or placement of the of the resist layer 35, such as by sputtering, to help facilitate the formation or performance of a subsequently formed conductive layers, such as the conductive interconnects 52.

After formation of the resist layer 48, the resist layer 48 can then be exposed and developed to form openings 50 in the resist layer 48. The openings 50 can be positioned over, or within a footprint of, the peripheral area 29 of the temporary carrier 27. The openings 50 can extend completely through the resist layer 48, such as from a first surface or bottom surface 49 of the resist layer 48 to second surface or top surface 51 of the resist layer 48 opposite the first surface 49. An ADI of the developed resist layer 48 and the openings 50 can be performed to detect the condition or quality of the openings 50. After the ADI of resist layer 48 and openings 50, a descum operation can be performed on the developed resist layer 48.

Figure 2E:
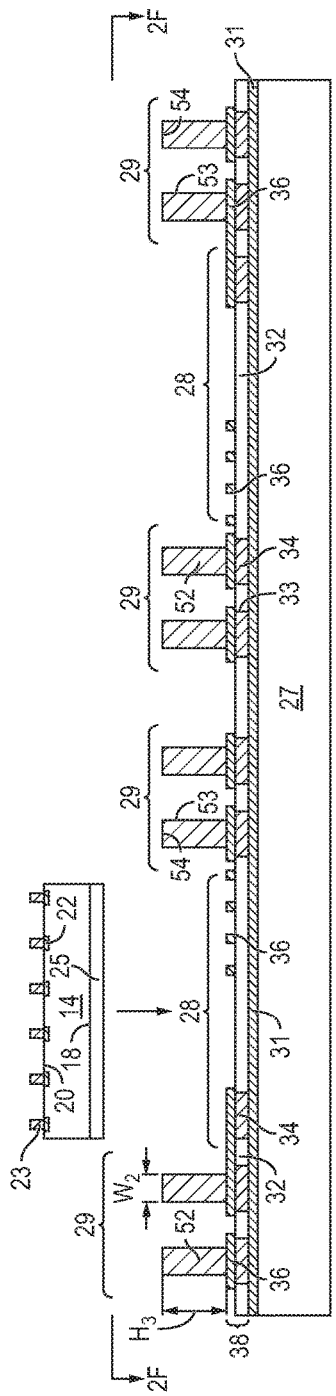

FIG. 2E shows that of a plurality of conductive interconnects 52 can be formed within the openings 50 in the resist layer 48 to form columns, pillars, posts, bumps, or studs of copper or other suitable conductive material. Conductive interconnects 52 can be formed using patterning and metal deposition processes such as printing, PVD, CVD, sputtering, electrolytic plating, electroless plating, metal evaporation, metal sputtering, or other suitable metal deposition process. When conductive interconnects 52 are formed by plating, the seed layer can be used as part of the plating process. Conductive interconnects 52 can be one or more layers of Al, Cu, Sn, Ni, Au, Ag, Pd, solder, or other suitable electrically conductive material and can include one or more layers. When forming the conductive interconnects 52 of multiple portions, such as vertically stacked portions of different conductive materials, the plating or formation of the conductive interconnects 52 can be part of multiple sequential processes.

As shown in FIG. 2E, after formation of the conductive interconnects 52, the resist layer 48 can be removed, such as by a stripping process, leaving conductive interconnects 52 in the peripheral area 29 around the semiconductor die mounting sites 28 to provide for subsequent vertical or 3D electrical interconnection for the semiconductor devices 90. Conductive interconnects 52 can include a height H3 in a range of 100-300 µm, 150-250 µm, of about 200 µm, or greater than 100 µm. Conductive interconnects 52 can include a width or diameter W2 in a range of 30-100 µm or a width in a range of 50-80 µm, or a width of about 65 µm. After removal of the resist layer 48, the semiconductor die mounting sites 28 on or over the temporary carrier 27, the insulating layer 32, the pads 34, and the conductive layer 36 can be exposed and ready to receive the semiconductor die 14. The orientation of semiconductor die 14 can be either face up with active surface 20 oriented away from the temporary carrier 27 to which the semiconductor die 14 are mounted, or alternatively can be mounted face down with the active surface 20 oriented toward the temporary carrier 27 to which the semiconductor die 14 are mounted. After mounting the semiconductor die 14 to the temporary carrier 27 at the semiconductor die mounting sites 28 or amidst the conductive interconnects 52 in a face up orientation, the DAF 25 can undergo a curing process to cure the DAF 25 and to lock the semiconductor die 14 in place over the temporary carrier 27.

Figure 2F:
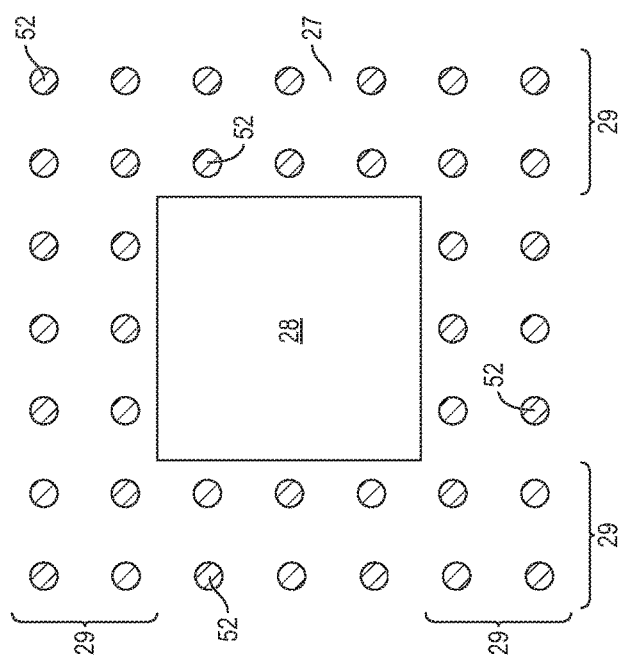

FIG. 2F shows a top or plan view of a portion of the temporary carrier 27 and the conductive interconnects 52 taken along the section line 2F-2F from FIG. 2E, after formation of conductive interconnects 52 and before mounting of the semiconductor die 14 in the mounting sites 28. FIG. 2F shows that the conductive interconnects 52 can be formed within, and extend intermittently across, the peripheral area 29 and surround the semiconductor die mounting sites 28 without being formed within the semiconductor die mounting sites 28.

FIG. 2G shows that after mounting the semiconductor die 14 to the semiconductor die mounting sites, a mold compound, encapsulant, or encapsulating material 56 can be deposited around the plurality of semiconductor die 14 using a paste printing, compression molding, transfer molding, liquid encapsulant molding, lamination, vacuum lamination, spin coating, or other suitable applicator. The mold compound 56 can be a polymer composite material, such as epoxy resin with filler, epoxy acrylate with filler, or polymer with proper filler. Semiconductor die 14 can be embedded together in mold compound 56, which can be non-conductive and environmentally protect the semiconductor die 14 from external elements and contaminants. The mold compound 56 can be formed adjacent to and directly contact all lateral sides of the semiconductor die (such as four sides), as well as be formed over the active surface 20 of the semiconductor die 14. The mold compound 56 can also be formed around and directly contact the sides of the conductive bumps 23 and the conductive interconnects 52 to form a reconstituted panel, reconstituted wafer, molded panel, or molded wafer 58.

The reconstituted panel 58 can optionally undergo a curing process or post mold cure (PMC) to cure the mold compound 56. In some instances, a top surface, front surface, or first surface 62 of the mold compound 56 can be substantially coplanar with first end 53 of the conductive interconnects 52. Alternatively, the top surface 62 of the mold compound 56 can be over, offset, or vertically separated from the first ends 53 of the conductive interconnects 52, such that the first ends 53 of the conductive interconnects 52 are exposed with respect to the encapsulant 56 after the reconstituted wafer 58 undergoes a grinding operation.

The reconstituted panel 58 can also undergo an optional grinding operation with grinder 64 to planarize the top surface, front surface, or first surface 68 of the reconstituted panel 58 and to reduce a thickness of the reconstituted panel 58, and to planarize the top surface 62 of the mold compound 56 and to planarize the top surface 68 of the reconstituted panel 58. The top surface 68 of the reconstituted panel 58 can comprise the top surface 62 of the mold compound 56, the first ends of the conductive interconnects 52, or both. A chemical etch can also be used to remove and planarize the mold compound 56 and the reconstituted panel 58. Thus, the top surface 68 of the conductive interconnects 52 can be exposed with respect to mold compound 56 in the peripheral area 29 to provide for electrical connection between semiconductor die 14 and a subsequently formed redistribution layer or build-up interconnect structure.

The reconstituted wafer 58 can also undergo a panel trim or trimming to remove excess mold compound 56 that has remained in undesirable locations as a result of a molding process, such as eliminating a flange present from a mold chase. The reconstituted panel 58 can include a footprint or form factor of any shape and size including a circular, rectangular, or square shape, the reconstituted wafer 58 comprising a diameter, length, or width of 200 mm, 300 mm, or any other desirable size.

FIG. 2G also shows that actual positions of the semiconductor die 14 within the reconstituted panel 58 can be measured with an inspection device or optical inspection device 59. As such, subsequent processing of the fully molded panel 58 as shown and described with respect to FIG. 2H can be performed with respect to the actual positions of the semiconductor die 14 within the reconstituted panel 58.

FIG. 2H shows forming a build-up interconnect structure 70 over the molded panel 58 to electrically connect, and provide routing between, conductive interconnects 52 and the conductive bumps 23. While the build-up interconnect structure 70 is shown comprising three conductive layers and three insulating layer, a person of ordinary skill in the art will appreciate that fewer layers or more layers can be used depending on the configuration and design of the semiconductor device 90. The build-up interconnect structure 70 can optionally comprise a first insulating or passivation layer 72 formed or disposed over the reconstituted panel 58. The first insulating layer 72 can comprise one or more layers of $SiO_2$, $Si_3N_4$, SiON, $Ta_2O_5$, $Al_2O_3$, or other material having similar insulating and structural properties. The insulating layer 72 can be formed using PVD, CVD, printing, spin coating, spray coating, sintering or thermal oxidation. Openings or first level conductive vias can be formed through the insulating layer 72 over the conductive interconnects 52 and the conductive bumps 23 to connect with the semiconductor die 14.

A first conductive layer 74 can be formed over the reconstituted panel 58 and over the first insulating layer 72 as a first RDL layer to extend through the openings in the first insulating layer 72, to electrically connect with the first level conductive vias, and to electrically connect with the conductive bumps 23 and the conductive interconnects 52. Conductive layer 74 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 76, which can be similar or identical to the first insulating layer 72, can be disposed or formed over the reconstituted panel 58, the first conductive layer 74, and the first insulating layer 72. An opening or second level conductive via can be formed through the second insulating layer 76 to connect with the first conductive layer 74.

A second conductive layer 78, which can be similar or identical to the first conductive layer 74, can be formed as a second RDL layer over reconstituted panel 58, over the first insulating layer 72, over the first conductive layer 74, over the second level conductive via, or within an opening of the second insulating layer 72, to electrically connect with the first conductive layer 74, the first level and second level conductive vias, and the semiconductor die 14.

A third insulating or passivation layer 80, which can be similar or identical to the first insulating layer 72, can be disposed or formed over the second conductive layer 78 and the second insulating layer 76. An opening or a third level conductive via can also be formed in or through the third insulating layer 80 to connect with the second conductive layer 78.

A third conductive layer or UBMs 82 can be formed over the third insulating layer 80 and the third level conductive via to electrically connect with the other conductive layers and conductive vias within the build-up interconnects structure 70, as well as electrically connect to the semiconductor die 14, the conductive bumps 23, and the conductive interconnects 52. UBMs 82, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), Pd, TiW, or chromium copper (CrCu). In some instances the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently formed bumps, balls, or interconnect structures 84. In some instances, the wetting layer can comprise a layer of Cu with a thickness in a range of about 5-11 µm or 7-9 µm. Bumps 84, such as when formed of SnAg solder, can consume some of the Cu UBM during reflow and forms an intermetallic compound at the interface between the solder bump 84 and the Cu of the wetting layer. However, the Cu of the wetting layer can be made thick enough to prevent full consumption of the Cu pad by the solder during high temperature aging.

In some instances, the UBMs 82 can comprise Ni, Pd and Au. UBMs 82 can provide a low resistive interconnect to build-up interconnect structure 70 as well as a barrier to solder diffusion and seed layer for solder wettability. A space or gap 60 can exist between various semiconductor devices 90 that will be singulated from the reconstituted panel 58.

Figure 2I:
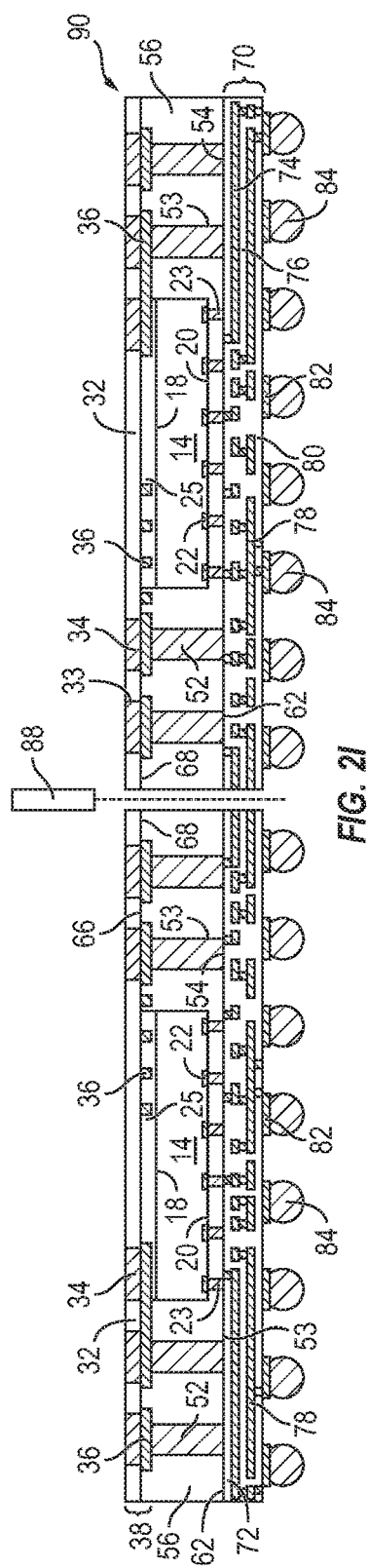

FIG. 2I shows that the temporary carrier 27 can be removed, such as after the formation of the build-up interconnect structure 70, to expose the pads 34 and the insulating layer or epoxy resist laminate 32. The temporary carrier 27 can be removed, e.g., by grinding the temporary carrier 27, by exposing UV release tape 30 to UV radiation to separate the UV tape 30 from the glass substrate 27, or other suitable method. In other instance, the UV release tape 30 can be avoided, and after processing, the molded panel or temporary carrier 27 can be removed, such as by being ground off, to expose the PoP land pads, thick UBM layer, or pads 34 after having completed the build-up interconnect structure 70. As such, the molded panel 27 can replace a conventional carrier with temporary tape, offsetting or reducing some cost in the making of the semiconductor device or package 90. After removal of the temporary carrier 27, the reconstituted panel 58 can also undergo an etching process, such as a wet etch, to clean the surface of the reconstituted panel 58 exposed by removal of the temporary carrier 27, including the pads 34 and the insulating layer or epoxy resist laminate 32, without the second ends 54 of the conductive interconnects 52 being exposed.

The exposed pads 34 can also undergo a coating or pad finishing process, such as by an Organic Solderability Preservative (OSP) coating, solder printing, electroless plating, or other suitable process, to form a PoP UBM pad, UBM structures, or land pads 86. The UBMs 86 can comprise a multiple metal stack of one or more of an adhesion layer, barrier layer, seed layer, or wetting layer. The adhesion layer can comprise Ti, TiN, TiW, Al, or Cr. The barrier layer can be formed over the adhesion layer and can be made of Ni, NiV, Pt, Pd, TiW, or CrCu. The barrier layer can inhibit unwanted diffusion of material, like Cu. The seed layer can be Cu, Ni, NiV, Au, or Al. The seed layer can be formed over the conductive pads 34 and can act as an intermediate conductive layer below subsequently formed PoP bumps, balls, or interconnect structures. In some instances, the UBMs 86 can comprise Ni and Au. UBMs 86 can provide a low resistive interconnect as well as a barrier to solder diffusion and seed layer for solder wettability.

In some instances, the pads 34 and 86, on both opposing top and bottom or frontside and backsides of the package 90 can undergo an electroless nickel palladium (NiPd) and immersion Au surface finish so that both the UBMs and PoP land pads can be treated before a ball drop or attachment of the bumps 84.

Opposite the UBMs 86, bumps, balls, or interconnect structures 84, can be formed on the UBM pad 82 and over the build-up interconnect structure 70. The bumps 84 can be formed by depositing an electrically conductive bump material over UBMs 82 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to UBMs 82 using a suitable attachment or bonding process. In one embodiment, the bump material is reflowed by heating the material above its melting point to form spherical balls or bumps 84. In some applications, bumps 84 are reflowed a second time to improve electrical contact to UBMs 82. The bumps 84 can also be compression bonded or thermocompression bonded to the UBM layer 82. Bumps 84 represent one type of interconnect structure that can be formed over UBM 82. The interconnect structure can also use bond wires, conductive paste, stud bump, micro bump, or other electrical interconnects.

FIG. 2I also shows singulation of the molded panel 58 and build-up interconnect structure 70 with saw blade or laser cutting tool 88 to form individual semiconductor devices or packages 90.

Figure 2J:
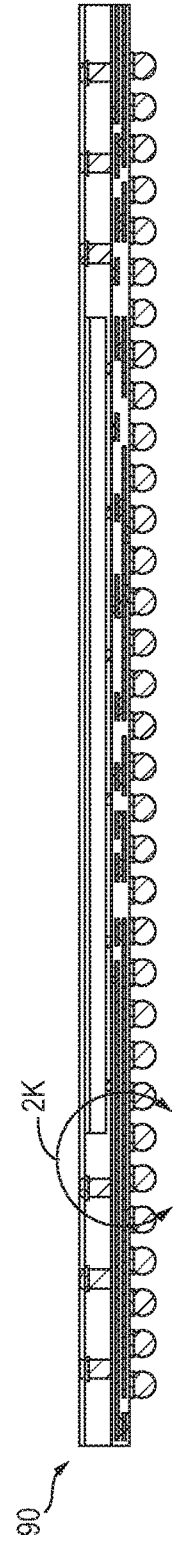

FIG. 2J shows a cross-sectional profile view of a final semiconductor device 90 with peripheral conductive interconnect structures 52 disposed around, and laterally offset from, the semiconductor die 14 and within the encapsulant material 56. The peripheral conductive interconnect structures 52 can extend completely through the encapsulant 56 in a vertical direction from the top surface 62 of the encapsulant 56 to the bottom surface 66 of the encapsulant 56 opposite top surface 62 to provide vertical electrical interconnection through the semiconductor device 90, which can facilitate stacking of packages in PoP arrangements.

Figure 2K:
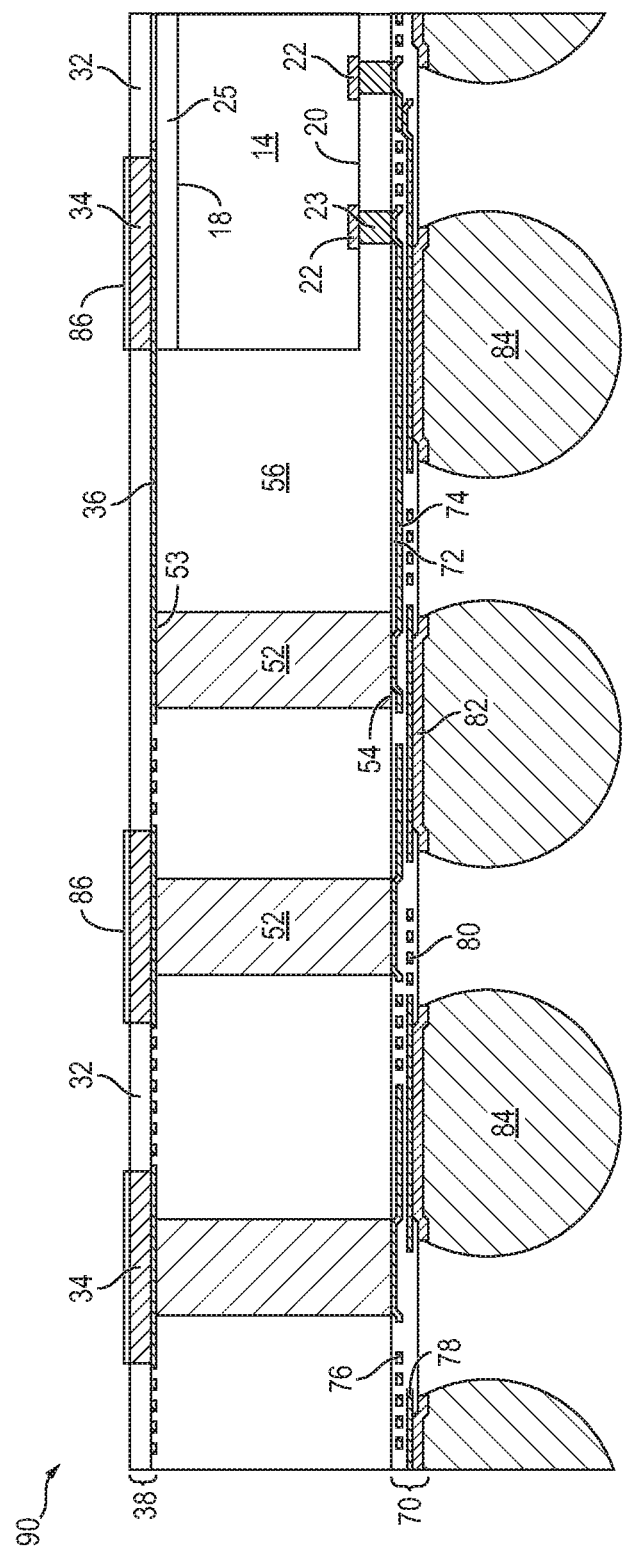

FIG. 2K shows a close-up view of a portion of the cross-sectional profile view of the semiconductor device 90 shown in FIG. 2J, taken at the section line 2K-2K. FIG. 2K shows that the backside 18 of the semiconductor die 14 can comprise the DAF 25 used to attach the die 14 face-up to the insulating layer 32 and the pads 34 during the encapsulation process with the mold compound 56, the DAF 25 becoming a part of a final structure of the semiconductor device 90. Keeping the DAF 25 as part of the semiconductor device 90 can balance a thermal expansion mismatch at both sides 18, 20 of the semiconductor die 14, thereby reducing warpage of the package 90.

FIG. 2K also shows that height or overall body thickness H4 of the package 90 can comprise a height (exclusive of the bumps 84) that is less than or equal to 300 μm. In some instances, the overall height of the package including the bumps 84, can also be less than or equal to 300 μm. FIG. 2K also shows a diameter, width, or size of the land pads 34 and the conductive interconnects 52 can be different from each other, such as the conductive pads or land pads 34 comprising a diameter or width W1 that is greater than the width W2 of the conductive interconnects 52, thereby creating an offset or step between the conductive pads 34 and the conductive interconnects 52, which also provides a larger capture area for bumps or ball subsequently formed on the backside 91 of the package 90, while also decreasing a size or diameter of the conductive interconnects 52, which in turn reduces an amount of material used for the conductive interconnects 52, and an amount of time needed to plate or form the conductive interconnects 52.

By using the epoxy resist laminate 32 as part of the backside or topside build-up interconnect layer 38, an alternate structure comprising a printed circuit board (PCB) can be avoided thereby avoiding a structure that would comprise an overall height or thickness 3-4 times greater than a height of the build-up interconnect structure 38. Additionally, formation and inclusion of the fine pitch RDL structure 36 that fans in over the backside 18 of the semiconductor die 14 at the backside or top side 91 of the package 90 allows for a full ball grid array (BGA) or space for bumps or interconnects distributed across an entire back or top surface 91 of the package 90, instead of just having conductive bumps or balls formed directly over the conductive interconnects 52, thereby increasing a number of interconnects that can be used.

As indicated above, in some instances the conductive pads 34 can be plated over the temporary carrier 27 and within the openings 32 in the insulating layer 30 to a height H2 of about 30 μm. In other instances, the conductive pads 34 can be plated to a height H2 greater than or equal to 10 μm before grinding or removal of the temporary carrier to expose the pads 34. Grinding of the temporary carrier and the conductive pads 34 can, in some instances, reduce the height by 0-4 μm, 1-3 μm, or a couple of micrometers, and a corresponding height or thickness can be added to the conductive pads 34 to compensate for the material that will be removed by grinding for arriving at a desired final height H2. When performing the grinding for removal of the temporary carrier 27, the seed layer 31 can be used to signal an end of the grinding process, and therefore reduce, prevent, or eliminate a need to undesirably remove material from conductive pads 34, or compensate for the same. For example, an amount of time or a change in current to the grinding mechanism 64 can be communicated in order to ensure removal of the seed layer 31, the temporary carrier 27, and to expose the conductive pads or POP land pads 34 without removing too much material from the land pads 34.

Figure 3:
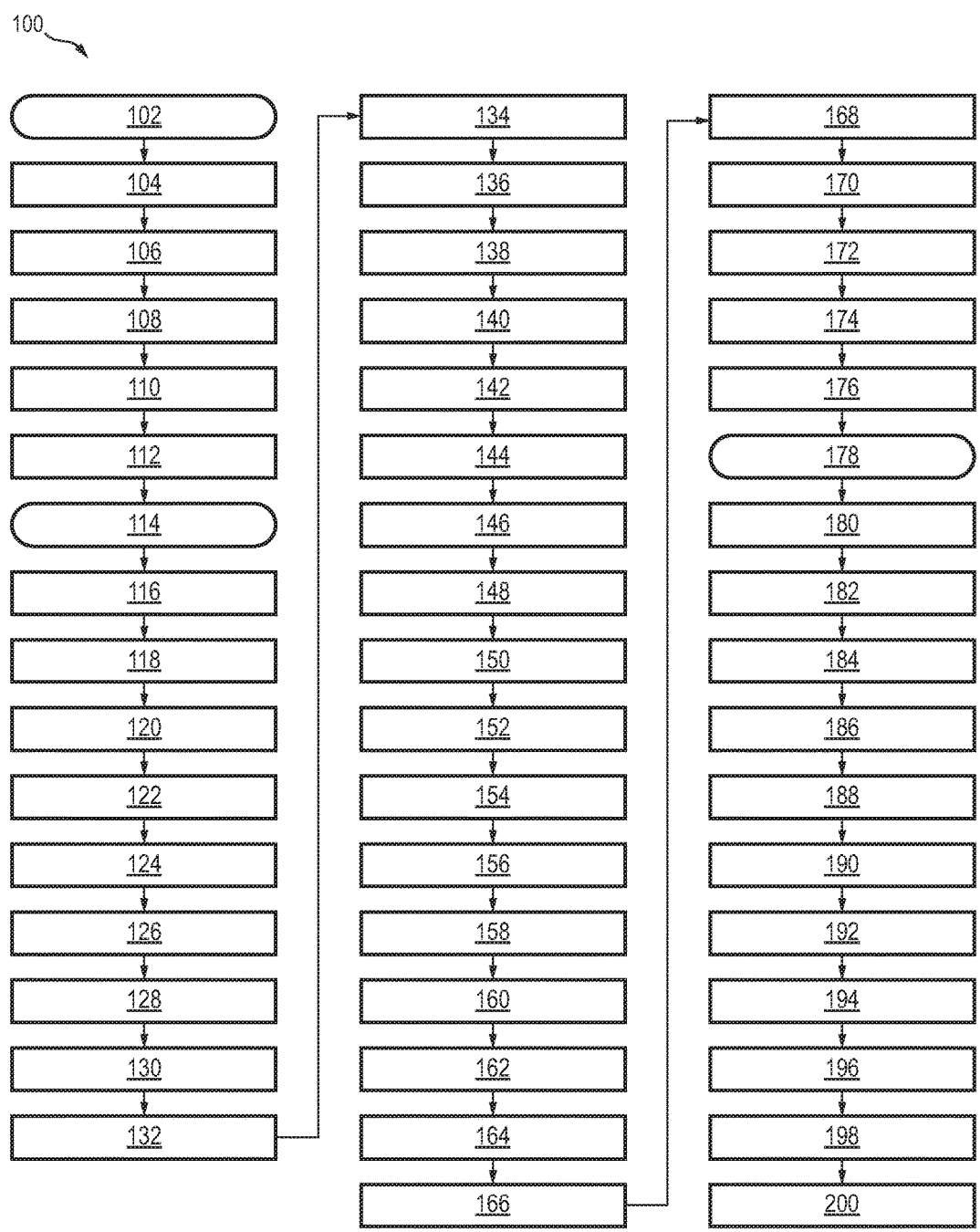
FIG. 3 shows a flow chart illustrating an aspect of processing used in a method of forming fully molded peripheral PoP devices.

FIG. 3 shows a flow chart 100 illustrating a non limiting-example of a method of forming the semiconductor devices or packages 90, as illustrated and described in FIGS. 1A-2H, 4A, and 4B. The elements, actions, or steps listed in FIG. 3 can be performed in the order or sequence shown, but need not be. Fewer elements as well as the order or sequence of the various elements included in forming the semiconductor device 90 can be modified without departing from the spirit and scope of the present disclosure.

By way of summary, elements 102-112 generally refer to processing on the native semiconductor wafer 10 containing the semiconductor die 14, as shown in FIGS. 1A-1D, and can be processed at a same time, or in parallel with, the processing that occurs at elements 114-158 because the temporary carrier 27 receives, or allows for mounting of, the semiconductor die 14 from elements 102-112. As such, elements 114-158 can refer to the processing that occurs before mounting of the semiconductor die 14. Elements 160-162 refer to the mounting and curing of the semiconductor die 14. Elements 164-198 refer to the molding or encapsulating that forms the reconstituted wafer or m-series panel 58 of FIG. 2G, as well as the subsequent processing of the reconstituted panel 58 and the formation of the package 90. Below, the processing at each of the elements shown in the flow chart 100 of FIG. 3 are presented below in greater detail.

Element 102 represents providing the semiconductor wafer 10, as shown in FIG. 1A. The subsequent processing presented in elements 102-112 can occur with respect to the semiconductor wafer 10 as shown in FIGS. 1B-1D. More specifically, element 104 represents forming the conductive interconnects 28 over the semiconductor die 14 and in contact with contact pads 22, while the semiconductor die 14 are part of the semiconductor wafer 10. Element 106 represents thinning the semiconductor wafer 10. Element 108 represents attaching the DAF 25 to the semiconductor wafer 10. Element 110 represents laser grooving the semiconductor wafer 10 at, or within, the saw streets 16. Element 112 represents dicing or saw cutting the semiconductor wafer 10 using saw blade or laser cutting tool 32.

Element 114 represents providing the temporary carrier 27, on which the subsequent processing represented by elements 114-158 can occur before the mounting of semiconductor die 14. Element 116 represents sputtering the seed layer 31 over the temporary carrier 27. Element 118 represents forming the resist layer insulating layer 32 over the seed layer 31. Element 120 represents exposing the resist layer 32. Element 122 represents developing the exposed resist layer 32 to form openings 33 in the resist layer 32. Element 124 represents performing an ADI on the developed resist layer 32 and the openings 33. Element 126 represents performing a descum operation on the developed resist layer 32. Element 128 represents forming or plating the pads or conductive interconnects 34, and element 130 optionally planarizing the same. Element 132 represents optionally sputtering seed layer. Element 134 represents forming resist layer 35. Element 136 represents exposing the resist layer 35 while element 138 represents developing the resist layer 35. Element 140 represents descumming the resist layer 35. Element 142 represents forming or plating the RDL layer 36.

Element 144 represents resist strip and etch. After the formation of the conductive layer 36, the conductive interconnects 52 can then be formed as represented by elements 146-158. Element 146 represents optionally sputtering a seed layer. Element 148 represents forming the resist layer 48. Element 150 represents exposing the resist layer 48. Element 152 represents developing the resist layer 48 to form openings 50. Element 154 represents descumming the resist layer 48 and the openings 50. Element 156 represents forming or plating the conductive interconnects 52. Element 158 represents stripping and etching the resist layer 48.

Element 160 represents mounting the semiconductor die 14 to the temporary carrier 27. Element 162 represents curing the DAF 30 to lock the semiconductor die 14 in place over the temporary carrier 27, within the die attach area 28. Element 164 represents molding or encapsulating the semiconductor die 14, the conductive bumps 23, and the conductive interconnects 52 with mold compound or encapsulant 56 to form a reconstituted panel 58. Element 166 represents a PMC of the mold compound 56. Element 168 represents grinding top surface 62 of the mold compound 56. Element 170 represents a wet etch of the reconstituted panel 58 after the grinding with grinder 64, after which first ends 53 are exposed. Element 172 represents a panel trim or trimming of the reconstituted wafer 58 that can eliminate a flange present for a mold chase. Element 174 represents measuring an actual position of the semiconductor die 14 within the reconstituted panel 58. Element 176 represents having a fully molded panel 58 in which the actual position of the semiconductor die 14 within the fully molded panel 58 are known. The subsequent processing at elements 178-198 can occur with respect to the fully molded panel 58 represented by element 178.

Elements 180-190 represent forming a build-up interconnect structure 70 over the molded panel 58. More specifically, element 180 represents optionally forming a first insulating or passivation layer 72 over the molded panel 58, and first level conductive vias through the insulating layer 72 to connect with the semiconductor die 14. Element 182 represents forming a first conductive layer 74 as a first RDL layer to electrically connect with the first level conductive vias to electrically connect with the conductive bumps 28 and the conductive interconnects 52. Element 184 represents a second insulating or passivation layer 76 disposed or formed over the first conductive layer 74 and the first insulating layer 72, as well as a second level conductive via formed through the second insulating layer 76 to connect with the first conductive layer 74. Element 186 represents forming a second conductive layer 78 as a second RDL layer over the first conductive layer 74 and the first insulating layer 72 to electrically connect with the first conductive layer 74 and the first level and second level conductive vias. Element 188 represents a third insulating or passivation layer 80 disposed or formed over the second conductive layer 78 and the second insulating layer 76, as well as a third level conductive via formed through the third insulating layer 80 to connect with the second conductive layer 78. Element 190 represents forming a third conductive layer 82 as a UBM layer over the third insulating layer and the third level conductive via to electrically connect with the other conductive layers and conductive vias within the build-up interconnects structure 70 and the semiconductor die 14, such as through the conductive bumps 28, and the conductive interconnects 52.

Element 192 represents removing the temporary carrier 40, such as by grinding to expose the conductive pads 34. Element 194 represents the molded panel 58 undergoing a wet etching process to clean the exposed second ends 54 of the conductive interconnects 52. Element 196 represents the exposed pads 34, and the UBMs 82 undergoing a coating or pad finishing process, such as by electroless plating or other suitable process, to form a PoP UBM pad or UBM structure 86. PoP pad 86 can comprise one or more conductive layers, such as nickel and gold, and can occur at both the top and bottom surfaces of the copper posts exposed at the top and bottom of the package at a same time. Element 198 represents a package interconnect, such as a bump or solder ball 84, being formed on the UBM pad 82. Element 200 represents singulation of the molded panel 58 and build-up interconnect structure 70 with saw blade or laser cutting tool 88 to form individual semiconductor devices or packages 90.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:

providing a temporary carrier comprising a semiconductor die mounting site;

forming an insulating layer over the temporary carrier;

forming openings within the insulating layer over the temporary carrier, the openings being positioned both within and without the semiconductor die mounting site;

forming conductive pads within the openings by disposing conductive material within the openings after forming the openings;

forming a backside redistribution layer (RDL) over the temporary carrier, the insulating layer, and the conductive pads before mounting a semiconductor die at the semiconductor die mounting site;

forming conductive interconnects over the temporary carrier in a periphery of the semiconductor die mounting site;

mounting a semiconductor die comprising electrical interconnect structures face up to the insulating layer at the semiconductor die mounting site with the electrical interconnect structures opposite the insulating layer;

encapsulating the conductive interconnects, backside RDL, and semiconductor die with a mold compound;

removing a portion of the mold compound to expose the conductive interconnects and the electrical interconnect structures of the semiconductor die;

forming a build-up interconnect structure connected to the semiconductor die and the conductive interconnects; and performing a planarization process to remove material from a surface of the insulating layer and the conductive pads to produce a uniformly flat surface, and removing the temporary substrate with a grinding process.

2. The method of claim 1, wherein:
the insulating layer comprises an epoxy resist laminate with a height or thickness H2 greater than 25 μm; and
the insulating layer, conductive pads, and conductive interconnects form a backside build-up interconnect structure.

3. The method of claim 2, wherein the conductive pads comprise a height or thickness H2 greater than 25 μm, and a width W1 greater than 60 μm.

4. The method of claim 1, wherein the conductive interconnects comprise copper posts comprising a height H3 greater than 100 μm.

5. The method of claim 1, wherein a height or overall body thickness of the semiconductor device is less than or equal to 300 μm.

6. The method of claim 1, wherein the temporary carrier is formed of a same material as the mold compound, the insulating layer, or both, to reduce a CTE mismatch and warpage during processing of the semiconductor device.

7. The method of claim 1, wherein the backside RDL comprises a fine pitch in a range of 10-30 μm.

8. A method of making a semiconductor device, comprising:
providing a temporary carrier comprising a semiconductor die mounting site;
forming an insulating layer over the temporary carrier;
forming conductive pads with a height or thickness H2 greater than 25 μm within openings in the insulating layer, the conductive pads being formed both within and without the die mounting site;
forming a backside redistribution layer (RDL) over the temporary carrier before mounting a semiconductor die at the semiconductor die mounting site;
forming conductive interconnects over the temporary carrier in a periphery of the semiconductor die mounting site;
mounting a semiconductor die face up to the backside RDL at the semiconductor die mounting site, the semiconductor die comprising electrical interconnect structures disposed opposite the backside RDL;
encapsulating the conductive interconnects, backside RDL, and semiconductor die with a mold compound;
removing a portion of the mold compound to expose first ends of the conductive interconnects and the electrical interconnect structures of the semiconductor die and to form a first surface of the mold compound coplanar with the first ends of the conductive interconnects and the electrical interconnect structures;
forming a build-up interconnect structure connected to the semiconductor die and the conductive interconnects; and
removing the temporary carrier to expose the insulating layer and the conductive pads formed with a uniformly flat surface.

9. The method of claim 8, further comprising:
forming an insulating layer over the temporary carrier; and
forming conductive pads within openings in the insulating layer before mounting the semiconductor die over the carrier;
wherein the conductive pads are electrically connected to the backside RDL.

10. The method of claim 9, wherein the conductive pads are positioned both within and without the semiconductor die mounting site to be disposed both within and without a footprint of the semiconductor die.

11. The method of claim 10, wherein:
the insulating layer comprises an epoxy resist laminate with a height or thickness H2 greater than 25 μm; and
the insulating layer, conductive pads, and conductive interconnects form a backside build-up interconnect structure.

12. The method of claim 8, further comprising:
forming the temporary carrier of a same material as the mold compound to reduce a CTE mismatch and warpage during processing of the semiconductor device; and
removing the temporary carrier in a grinding process.

13. The method of claim 8, wherein a height or overall body thickness of the semiconductor device is less than or equal to 300 μm.

14. The method of claim 8, wherein the conductive interconnects comprise copper posts comprising a height H3 greater than 100 μm.

15. A method of making a semiconductor device, comprising:
providing a temporary carrier;
forming an insulating layer over the temporary carrier;
forming openings within the insulating layer;
forming conductive pads within the openings in the insulating layer by disposing conductive material within the openings;
forming a backside redistribution layer (RDL) that extends over the conductive pads;
forming conductive interconnects over the temporary carrier;
mounting a semiconductor die over the temporary carrier amidst the conductive interconnects, the semiconductor die comprising electrical interconnect structures;
encapsulating the conductive interconnects and semiconductor die with a mold compound;
removing a portion of the mold compound to expose first ends of the conductive interconnects and the electrical interconnect structures of the semiconductor die to form a first surface of the mold compound coplanar with the first ends of the conductive interconnects and the electrical interconnect structures;
forming a build-up interconnect structure over the semiconductor die and the conductive interconnects; and
removing the temporary carrier to expose the insulating layer and the conductive pads formed with a uniformly flat surface.

16. The method of claim 15, further comprising forming a backside redistribution layer (RDL) over the temporary carrier before mounting the semiconductor die over the carrier.

17. The method of claim 15, further comprising:
forming the temporary carrier of a same material as the mold compound to reduce a CTE mismatch and warpage during processing of the semiconductor device; and
removing the temporary carrier in a grinding process to expose the conductive pads.

18. The method of claim 15, wherein the insulating layer, and conductive pads form a backside build-up interconnect structure over the temporary carrier before mounting the semiconductor die to the build-up interconnect structure and over the temporary carrier.

19. The method of claim 15, wherein:
the insulating layer comprises an epoxy resist laminate with a height or thickness H2 greater than 25 μm; and
the conductive pads comprise a height or thickness H2 greater than 25 μm, and a width W1 greater than 60 μm.

20. The method of claim 15, wherein the conductive interconnects comprise copper posts comprising a height H3 greater than 100 μm.

* * * * *